United States Patent
Do et al.

(10) Patent No.: US 8,093,693 B2
(45) Date of Patent: Jan. 10, 2012

(54) INTEGRATED CIRCUIT PACKAGE SYSTEM WITH ENCAPSULATION LOCK

(75) Inventors: Byung Tai Do, Singapore (SG); Sung Uk Yang, Singapore (SG)

(73) Assignee: STATS ChipPac Ltd., Singapore (SG)

( * ) Notice: Subject to any disclaimer, the term of this patent is extended or adjusted under 35 U.S.C. 154(b) by 33 days.

(21) Appl. No.: 11/532,510

(22) Filed: Sep. 15, 2006

(65) Prior Publication Data

US 2008/0067698 A1    Mar. 20, 2008

(51) Int. Cl.
*H01L 23/495* (2006.01)
(52) U.S. Cl. .................. 257/672; 257/E23.031
(58) Field of Classification Search .................. 257/787
See application file for complete search history.

(56) References Cited

U.S. PATENT DOCUMENTS

| | | | |
|---|---|---|---|
| 5,753,969 A | 5/1998 | Suzuya et al. | |
| 5,973,388 A | 10/1999 | Chew et al. | |
| 6,166,430 A | 12/2000 | Yamaguchi | |
| 6,197,615 B1 | 3/2001 | Song et al. | |
| 6,448,633 B1 | 9/2002 | Yee et al. | |
| 6,483,178 B1 * | 11/2002 | Chuang | 257/672 |
| 6,501,161 B1 | 12/2002 | Lee | |
| 6,639,306 B2 | 10/2003 | Huang | |
| 6,661,083 B2 | 12/2003 | Lee et al. | |
| 6,815,833 B2 | 11/2004 | Lee et al. | |
| 7,042,071 B2 | 5/2006 | Minamio et al. | |
| 7,060,535 B1 | 6/2006 | Sirinorakul et al. | |
| 7,060,536 B2 | 6/2006 | Punzalan et al. | |
| 7,221,045 B2 | 5/2007 | Park et al. | |
| 2002/0079561 A1 * | 6/2002 | Yasunaga et al. | 257/670 |
| 2004/0046240 A1 | 3/2004 | Hasebe et al. | |
| 2004/0084757 A1 | 5/2004 | Seo | |
| 2004/0227217 A1 | 11/2004 | Jang | |
| 2004/0262781 A1 | 12/2004 | Germain et al. | |
| 2005/0051876 A1 | 3/2005 | Manalac et al. | |
| 2005/0258521 A1 | 11/2005 | Park et al. | |
| 2007/0170559 A1 | 7/2007 | Camacho et al. | |
| 2008/0067639 A1 | 3/2008 | Do et al. | |
| 2008/0067640 A1 | 3/2008 | Do et al. | |

OTHER PUBLICATIONS

K. Gilleo, Area Array Processes, McGraw Hill, 2004, p. 99.

* cited by examiner

*Primary Examiner* — Quoc Hoang
*Assistant Examiner* — Tony Tran
(74) *Attorney, Agent, or Firm* — Mikio Ishimaru

(57) ABSTRACT

An integrated circuit package system is provided including forming an external interconnect having a lead tip and a lead body, forming a recess in the lead body from a lead body top surface, connecting an integrated circuit die and the external interconnect, and molding the external interconnect with the recess filled.

9 Claims, 4 Drawing Sheets

INTEGRATED CIRCUIT PACKAGE SYSTEM WITH ENCAPSULATION LOCK

CROSS-REFERENCE TO RELATED APPLICATIONS

The present application contains subject matter related to concurrently filed U.S. patent application Ser. No. 11/532,509. The related application is assigned to STATS ChipPAC Ltd.

The present application also contains subject matter related to concurrently filed U.S. patent application Ser. No. 11/532,508. The related application is assigned to STATS ChipPAC Ltd.

TECHNICAL FIELD

The present invention relates generally to integrated circuit packages and more particularly to molded integrated circuit packages.

BACKGROUND ART

Modern electronics, such as smart phones, personal digital assistants, location based services devices, enterprise class servers, or enterprise class storage arrays, are packing more integrated circuits into an ever shrinking physical space with expectations for decreasing cost. Contemporary electronics expose integrated circuits and packages to more demanding and sometimes new environmental conditions, such as cold, heat, and humidity requiring integrated circuit packages to provide robust structures.

Numerous technologies have been developed to meet these requirements. Some of the research and development strategies focus on new technologies while others focus on improving the existing and mature technologies. Research and development in the existing technologies may take a myriad of different directions.

One proven way to reduce cost is to use mature package technologies with existing manufacturing methods and equipments. Existing packaging technologies struggle to cost effectively meet the ever demanding thermal, reliability, and structural requirements of today's integrated circuits and packages.

Most integrated circuit devices use molded plastic epoxy as an epoxy mold compound (EMC) for protecting package. But the poor heat dissipation property of EMC sometimes leads to device malfunctions. Some integrated circuit devices are large and/or very thin such that they become susceptible to warpage. Both heat and warpage may lead to delamination of the molding compound. The encapsulation delamination may also pose other problems, such as poor performance in moisture level sensitivity (MSL) tests.

A variation of existing technologies uses mature package technologies with lead fingers made from lead frames. However, lead frame packages typically use bond wires electrically connecting the lead fingers to the integrated circuit. Another variation of existing technologies uses solder bumps on the integrated circuit with a flip chip mounting. Yet another variation combines flip chip style mounting with lead frame packages.

The lead design of integrated circuit packages, such as quad flat nonleaded (QFN) packages, generally has a lug feature to provide locking between lead and mold compound. But, it adversely reduces metal-to-metal space and disturbs mold compound flow. This impact is bigger than other types of lead frame packages due to its inherently small size of the package. As a result, it causes reliability problem such as delamination between lead, tie-bar or paddle and mold compound or internal void. When it comes to the Flip Chip packages, die area covers more space above the paddle and some portion of leads as well and the problem tends to be more serious or more frequent.

Thus, a need still remains for an integrated circuit package system providing low cost manufacturing and improved reliability for the integrated circuit package. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming an external interconnect having a lead tip and a lead body, forming a recess in the lead body from a lead body top surface, connecting an integrated circuit die and the external interconnect, and molding the external interconnect with the recess filled.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
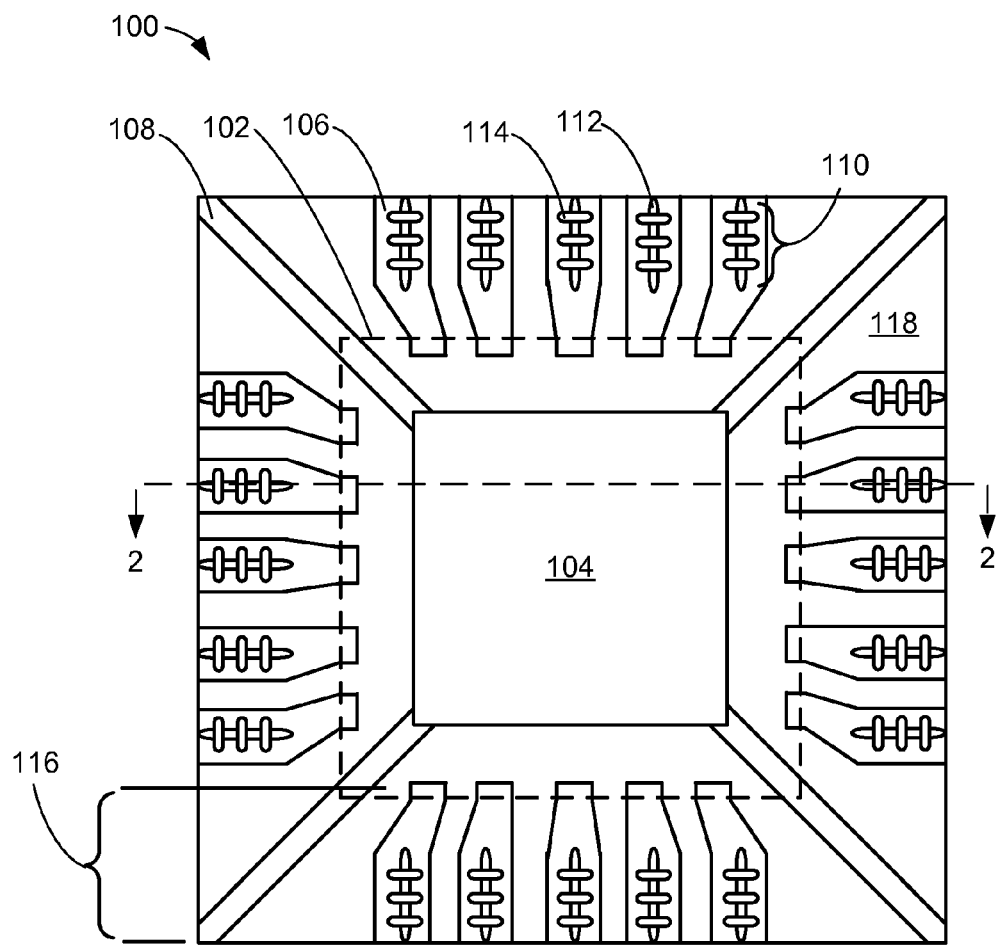
FIG. 1 is a plan view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a plan view of an integrated circuit package system 100 in an embodiment of the present invention. The integrated circuit package system 100 includes an integrated circuit die 102 over a paddle 104, such as die-attach paddle. The integrated circuit die 102 extends over a portion of external interconnects 106, such as leads, and tie bars 108. The tie bars 108 connect to the corners of the paddle 104.

Each of the external interconnects 106 has a recess 110, such as an intersecting recess segments. The recess 110 is located towards an edge of the integrated circuit package system 100. The recess 110 has a first recess segment 112 and a second recess segment 114. The first recess segment 112 being ellipsoidal and having a length and a width with the length extending along a length-wise dimension 116 of the external interconnects 106. The second recess segment 114 being ellipsoidal and having a length and a width with the length extending perpendicular to the first recess segment 112. The recess 110 has the first recess segment 112 and three instances of the second recess segment 114.

For illustrative purposes, the recess 110 as shown has one instance of the first recess segment 112 and three instances of the second recess segment 114, although it is understood that the number of the first recess segment 112 and the second recess segment 114 may differ. Also for illustrative purposes, the configuration of the recess 110 has the first recess segment 112 orthogonal with the second recess segment 114, although it is understood that the first recess segment 112 and the second recess segment 114 may be in a different configuration. Further, for illustrative purposes, the recess 110 is shown having both the first recess segment 112 and the second recess segment 114, although it is understood that the recess 110 may not have both the first recess segment 112 and the second recess segment 114.

An encapsulation 118, such as an epoxy mold compound, covers the integrated circuit die 102, the paddle 104, the tie bars 108, and the external interconnects 106. The encapsulation 118 fills the recess 110 in the external interconnects 106 forming mold locks. The tie bars 108 and the paddle 104 also provide mold locks. The mold locks form structural reinforcement holding the encapsulation 118 in place. The mold locks help resist delamination of the encapsulation and improves performance in moisture sensitivity level (MSL) test.

Figure 2:
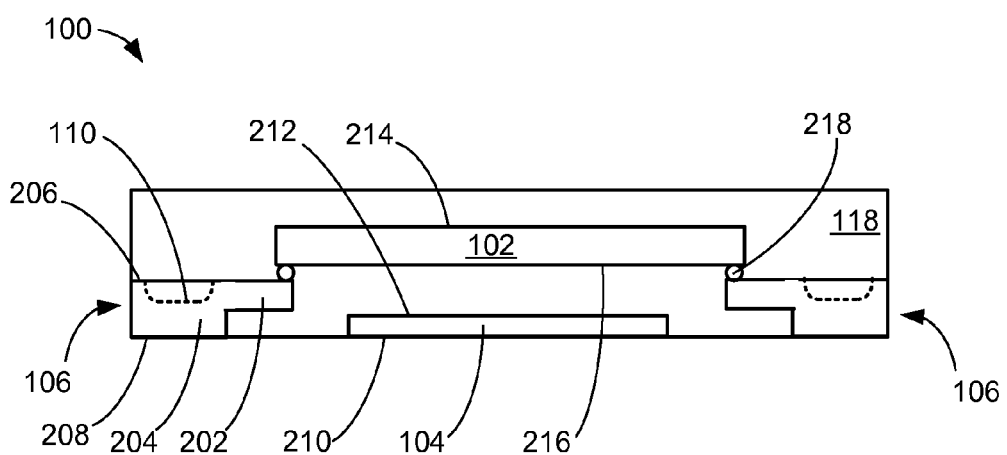
FIG. 2 is a cross-sectional view of the integrated circuit package system of FIG. 1.

Referring now to FIG. 2, therein is shown a cross-sectional view of the integrated circuit package system 100 of FIG. 1. The cross-sectional view is along segment 2-2 in FIG. 1. Each of the external interconnects 106 has a lead tip 202 and a lead body 204. The lead tip 202 may be formed by any number of processes, such as half etching the external interconnects 106.

The formation for the lead tip 202 also forms the lead body 204. The lead body 204 has the recess 110 from a lead body top surface 206 of the lead body 204. A lead body bottom surface 208 of the lead body 204 is used for connections to the next system level (not shown), such as a printed circuit board or another integrated circuit package system.

The paddle 104 is between the external interconnects 106. A paddle bottom surface 210 of the paddle 104 is in substantially the same horizontal plane as the lead body bottom surface 208. The paddle 104 may be formed by any number of processes, such as by half etching. A paddle top surface 212 of the paddle 104 is below the lead body top surface 206. The paddle 104 may serve multiple functions, such as thermal dissipation or ground connection.

For illustrative purpose, the paddle top surface 212 is described as not in substantially the same horizontal plane as the lead body top surface 206, although it is understood that the paddle top surface 212 and the lead body top surface 206 may be in substantially the same horizontal plane. Also for illustrative purposes, the paddle bottom surface 210 is described as in substantially the same horizontal plane as the lead body bottom surface 208, although it is understood that the paddle bottom surface 210 and the lead body bottom surface 208 may not be in substantially the same horizontal plane.

The integrated circuit die 102 has a non-active side 214 and an active side 216. The integrated circuit die 102 is over the paddle 104 and connect to the lead tip 202 with an internal interconnect 218, such as a solder bump. The internal interconnect 218 is on the active side 216. The connection of the internal interconnect 218 do not fill the recess 110. The encapsulation 118 fills the recess 110 to provide mold locks for the integrated circuit package system 100.

Figure 3:
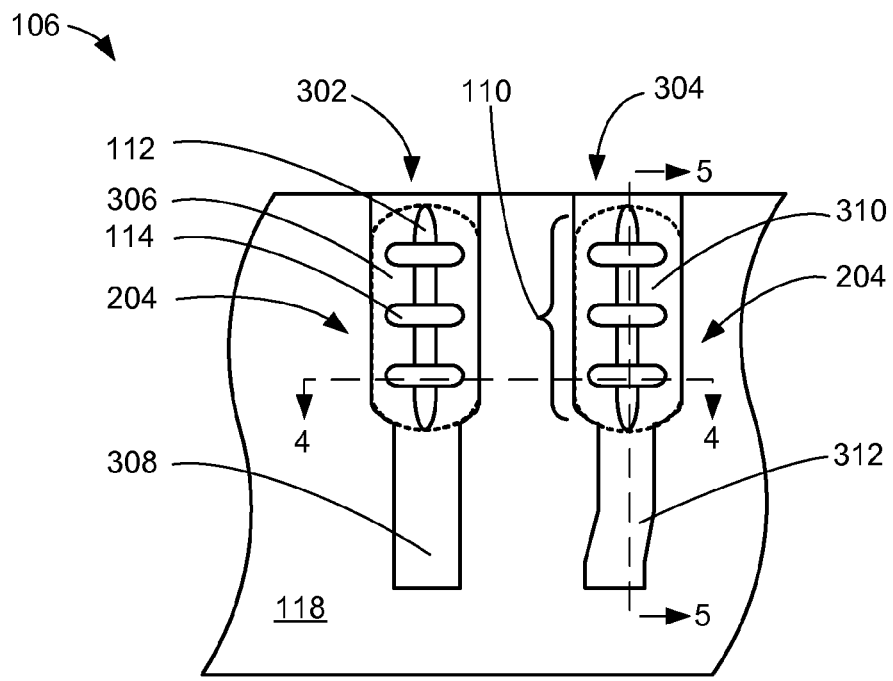
FIG. 3 is a more detailed plan view of a portion of the external interconnects in an embodiment of the present invention.

Referring now to FIG. 3, therein is shown a more detailed plan view of a portion of the external interconnects 106 in an embodiment of the present invention. This view depicts the portion of the external interconnects 106, such as a first external interconnect 302 and a second external interconnect 304.

The first external interconnect 302 has a first lead body 306 and a first lead tip 308. The first lead tip 308 is shown as a substantially straight segment extending from the first lead body 306. One instance of the recess 110 is in the first lead body 306. The second external interconnect 304 has a second lead body 310 and a second lead tip 312 The second lead tip 312 extends from the second lead body 310 with a displacement portion such that a tip end of the second lead tip 312 does not extend substantially straight from a body end of the second lead tip 312 next to the second lead body 310.

The first recess segment 112 has an orientation substantially parallel to the length-wise dimension 116, of FIG. 1, of the first lead body 306. The second recess segment 114 is perpendicular to and intersects the first recess segment 112 along the lead body top surface 206 of FIG. 2 in the first lead body 306. Similarly, one instance of the recess 110 is also part of the second lead body 310. The first recess segment 112 and the second recess segment 114 are in a similar configuration in the second external interconnect 304 as in the first external interconnect 302 including the recess 110 spaced away from an edge, substantially parallel to the length-wise dimension 116, of the lead body top surface 206, of FIG. 2. A perimeter of the first recess segment 112 and the second recess segment 114 may be open on the lead body top surface 206.

The encapsulation 118 of FIG. 1 fills in the recess 110, such as the first recess segment 112 and the second recess segment 114, to form a mold lock from the top of the lead body 204, such as the first lead body 306 and the second lead body 310. The recess 110, with the intersecting pattern, is part of the mold lock in the horizontal dimensions of the integrated circuit package system 100 of FIG. 1.

Figure 4:
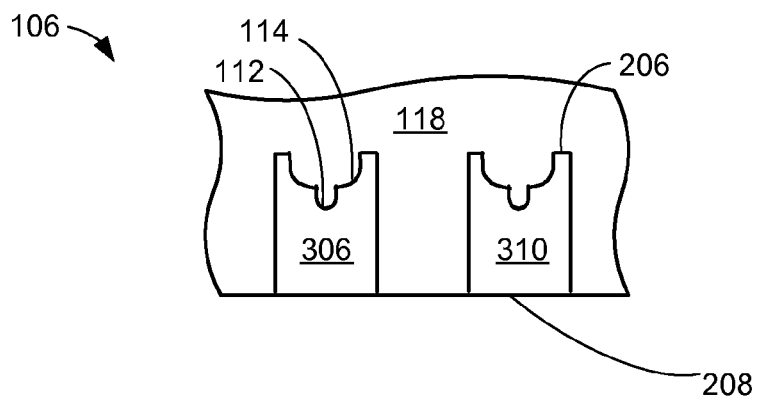
FIG. 4 is a cross-sectional view of the portion of the external interconnects of FIG. 3.

Referring now to FIG. 4, therein is shown a cross-sectional view of the portion of the external interconnects 106 of FIG. 3. The cross-sectional view is along the segment 4-4 in FIG. 3 showing the cross sections of the first lead body 306 and the second lead body 310.

The first lead body 306 has the second recess segment 114 in a curve shape from the lead body top surface 206. The first recess segment 112 is shown as another recess to the second intersecting recess segment and at a bottom portion of the second recess segment 114. The first recess segment 112 and the second recess segment 114 do not extend through the lead body bottom surface 208 of both the first lead body 306 and the second lead body 310. The encapsulation 118 fills the first recess segment 112 and the second recess segment 114.

Figure 5:
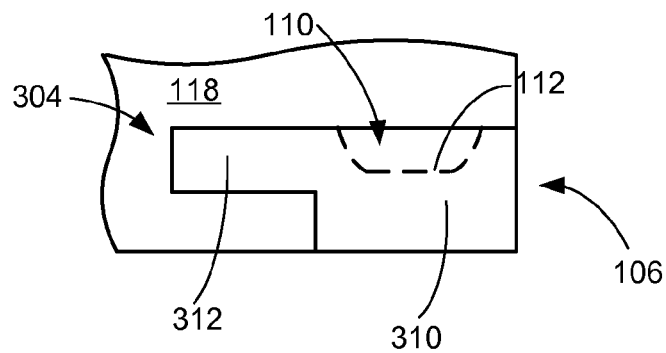
FIG. 5 is a different cross-sectional view of the portion of the external interconnects of FIG. 3.

Referring now to FIG. 5, therein is shown a different cross-sectional view of the portion of the external interconnects 106 of FIG. 3. The cross-sectional view is along the segment 5-5 in FIG. 3 showing the cross section of the second external interconnect 304 and may represent a similar cross section of any of the external interconnects 106 of FIG. 1.

This cross section shows the second lead tip 312 and the second lead body 310. An outline of the first recess segment 112 is shown as having a curve shape at the ends and flat in the middle. The first recess segment 112 is shown from the lead body top surface 206 and within the second lead body 310 while not part of the second lead tip 312. As mentioned earlier, the first recess segment 112 does not extend to the lead body bottom surface 208.

As mentioned earlier, the encapsulation 118 fills in the recess 110. The recess 110, with the paddle 104 of FIG. 1 and the lead tip 202 of FIG. 2, are also part of the mold lock in the vertical dimensions of the integrated circuit package system 100 of FIG. 1.

Figure 6:
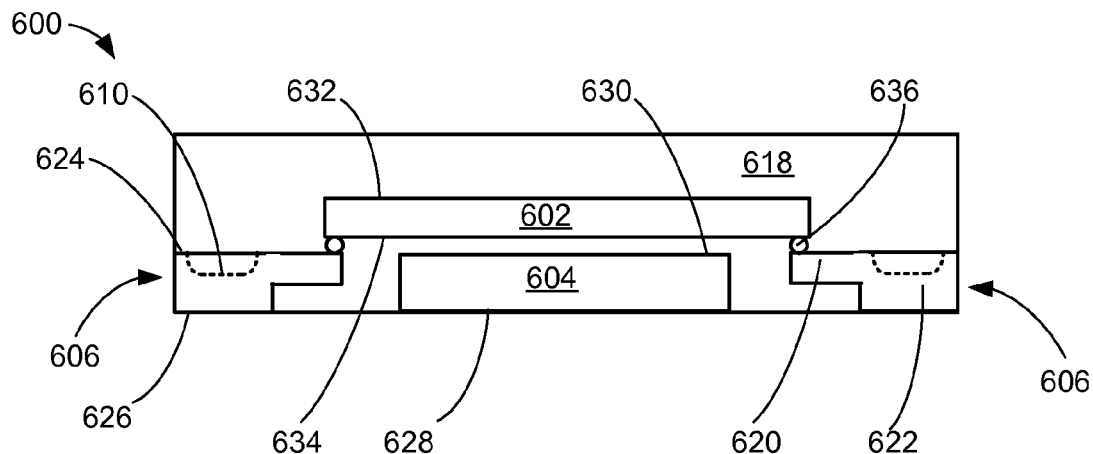
FIG. 6 is a cross-sectional view of an integrated circuit package system in an alternative embodiment of the present invention.

Referring now to FIG. 6, therein is shown a cross-sectional view of an integrated circuit package system 600 in an alternative embodiment of the present invention. This cross-sectional view may represent the cross section of the integrated circuit package system 100 along segment 2-2 in FIG. 1. Each of external interconnects 606 has a lead tip 620 and a lead body 622. The lead tip 620 may be formed by any number of processes, such as half etching the external interconnects 606.

The formation for the lead tip 620 also forms the lead body 622. The lead body 622 has a recess 610 from a lead body top surface 624 of the lead body 622. A lead body bottom surface 626 of the lead body 622 is used for connections to the next system level (not shown), such as a printed circuit board or another integrated circuit package system.

A paddle 604 is between the external interconnects 606. A paddle bottom surface 628 of the paddle 604 is in substantially the same horizontal plane as the lead body bottom surface 626. The paddle 604 may be formed by any number of processes, such as by punch or stamp of a lead frame (not shown). A paddle top surface 630 of the paddle 604 is in substantially the same horizontal plane as the lead body top surface 624. The paddle 604 may serve multiple functions, such as thermal dissipation or ground connection.

For illustrative purpose, the paddle top surface 630 is described as in substantially the same horizontal plane as the lead body top surface 624, although it is understood that the paddle top surface 630 and the lead body top surface 624 may not be in substantially the same horizontal plane. Also for illustrative purposes, the paddle bottom surface 628 is described as in substantially the same horizontal plane as the lead body bottom surface 626, although it is understood that the paddle bottom surface 628 and the lead body bottom surface 626 may not be in substantially the same horizontal plane.

An integrated circuit die 602 has a non-active side 632 and an active side 634. The integrated circuit die 602 is over the paddle 604 and connect to the lead tip 620 with an internal interconnect 636, such as a solder bump. The internal interconnect 636 is on the active side 634. The connection of the internal interconnect 636 do not fill the recess 610. An encapsulation 618 fills the recess 610 to provide mold locks for the integrated circuit package system 600.

Figure 7:
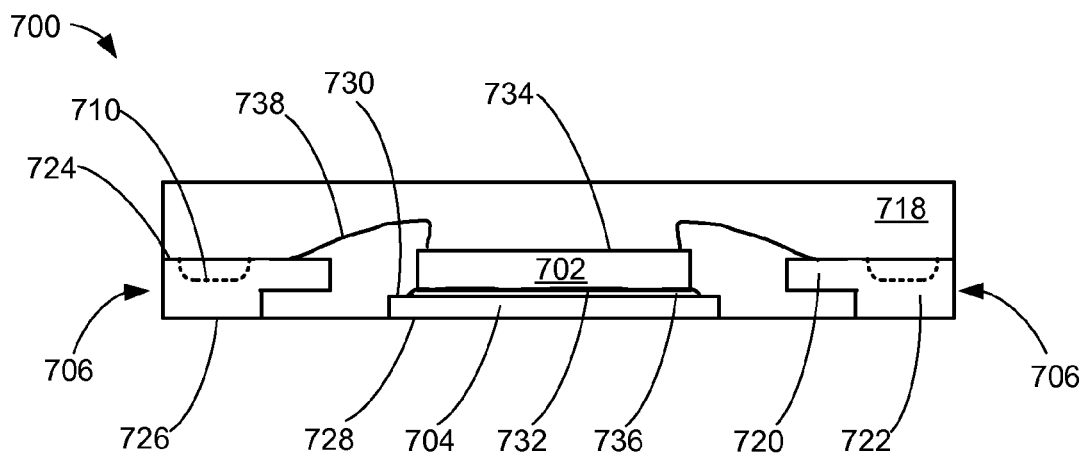
FIG. 7 is a cross-sectional view of an integrated circuit package system in another alternative embodiment of the present invention.

Referring now to FIG. 7, therein is shown a cross-sectional view of an integrated circuit package system 700 in another alternative embodiment of the present invention. Each of external interconnects 706 has a lead tip 720 and a lead body 722. The lead tip 720 may be formed by any number of processes, such as half etching the external interconnects 706.

The formation for the lead tip 720 also forms the lead body 722. The lead body 722 has a recess 710 from a lead body top surface 724 of the lead body 722. A lead body bottom surface 726 of the lead body 722 is used for connections to the next system level (not shown), such as a printed circuit board or another integrated circuit package system.

A paddle 704 is between the external interconnects 706. A paddle bottom surface 728 of the paddle 704 is in substantially the same horizontal plane as the lead body bottom surface 726. The paddle 704 may be formed by any number of processes, such as by half etching. A paddle top surface 730 of the paddle 704 is below the lead body top surface 724. The paddle 704 may serve multiple functions, such as thermal dissipation or ground connection.

For illustrative purpose, the paddle top surface 730 is described as not in substantially the same horizontal plane as the lead body top surface 724, although it is understood that the paddle top surface 730 and the lead body top surface 724 may be in substantially the same horizontal plane. Also for illustrative purposes, the paddle bottom surface 728 is described as in substantially the same horizontal plane as the lead body bottom surface 726, although it is understood that the paddle bottom surface 728 and the lead body bottom surface 726 may not be in substantially the same horizontal plane.

An integrated circuit die 702 has a non-active side 732 and an active side 734. The integrated circuit die 702 is attached on the paddle 704 with an adhesive 736 such as a die attach adhesive. The active side 734 connect to the lead tip 720 with an internal interconnect 738, such as bond wires. An encapsulation 718 fills the recess 710 to provide mold locks for the integrated circuit package system 700.

Figure 8:
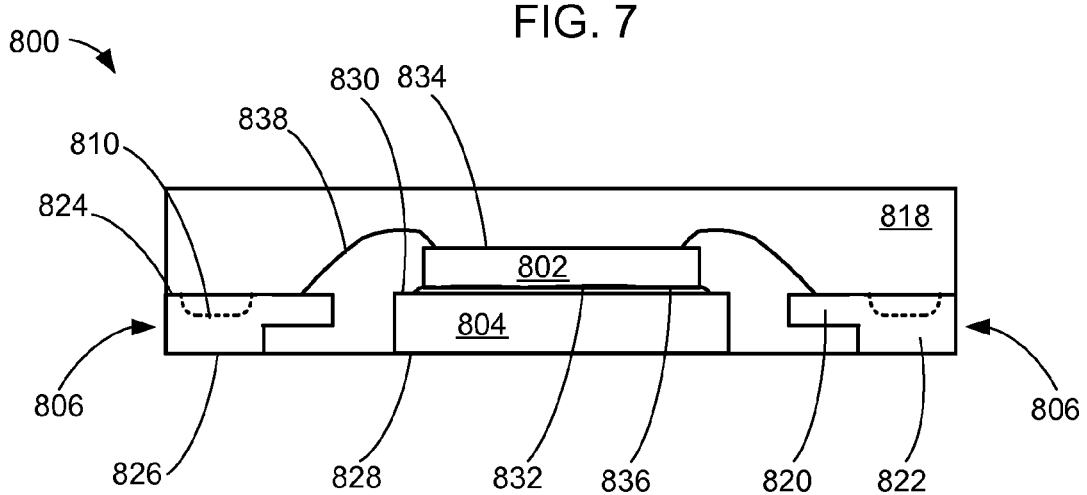
FIG. 8 is a cross-sectional view of an integrated circuit package system in yet another alternative embodiment of the present invention.

Referring now to FIG. 8, therein is shown a cross-sectional view of an integrated circuit package system 800 in yet another alternative embodiment of the present invention. Each of external interconnects 806 has a lead tip 820 and a lead body 822. The lead tip 820 may be formed by any number of processes, such as half etching the external interconnects 806.

The formation for the lead tip 820 also forms the lead body 822. The lead body 822 has a recess 810 from a lead body top surface 824 of the lead body 822. A lead body bottom surface 826 of the lead body 822 is used for connections to the next system level (not shown), such as a printed circuit board or another integrated circuit package system.

A paddle 804 is between the external interconnects 806. A paddle bottom surface 828 of the paddle 804 is in substantially the same horizontal plane as the lead body bottom surface 826. The paddle 804 may be formed by any number of processes, such as by punch or stamp of a lead frame (not shown). A paddle top surface 830 of the paddle 804 is in substantially the same horizontal plane as the lead body top surface 824. The paddle 804 may serve multiple functions, such as thermal dissipation or ground connection.

For illustrative purpose, the paddle top surface 830 is described as in substantially the same horizontal plane as the lead body top surface 824, although it is understood that the paddle top surface 830 and the lead body top surface 824 may not be in substantially the same horizontal plane. Also for illustrative purposes, the paddle bottom surface 828 is described as in substantially the same horizontal plane as the lead body bottom surface 826, although it is understood that the paddle bottom surface 828 and the lead body bottom surface 826 may not be in substantially the same horizontal plane.

An integrated circuit die 802 has a non-active side 832 and an active side 834. The integrated circuit die 802 is attached on the paddle 804 with an adhesive 836, such as a die attach adhesive. The active side 834 connect to the lead tip 820 with an internal interconnect 838, such as bond wires. An encapsulation 818 fills the recess 810 to provide mold locks for the integrated circuit package system 800.

Figure 9:
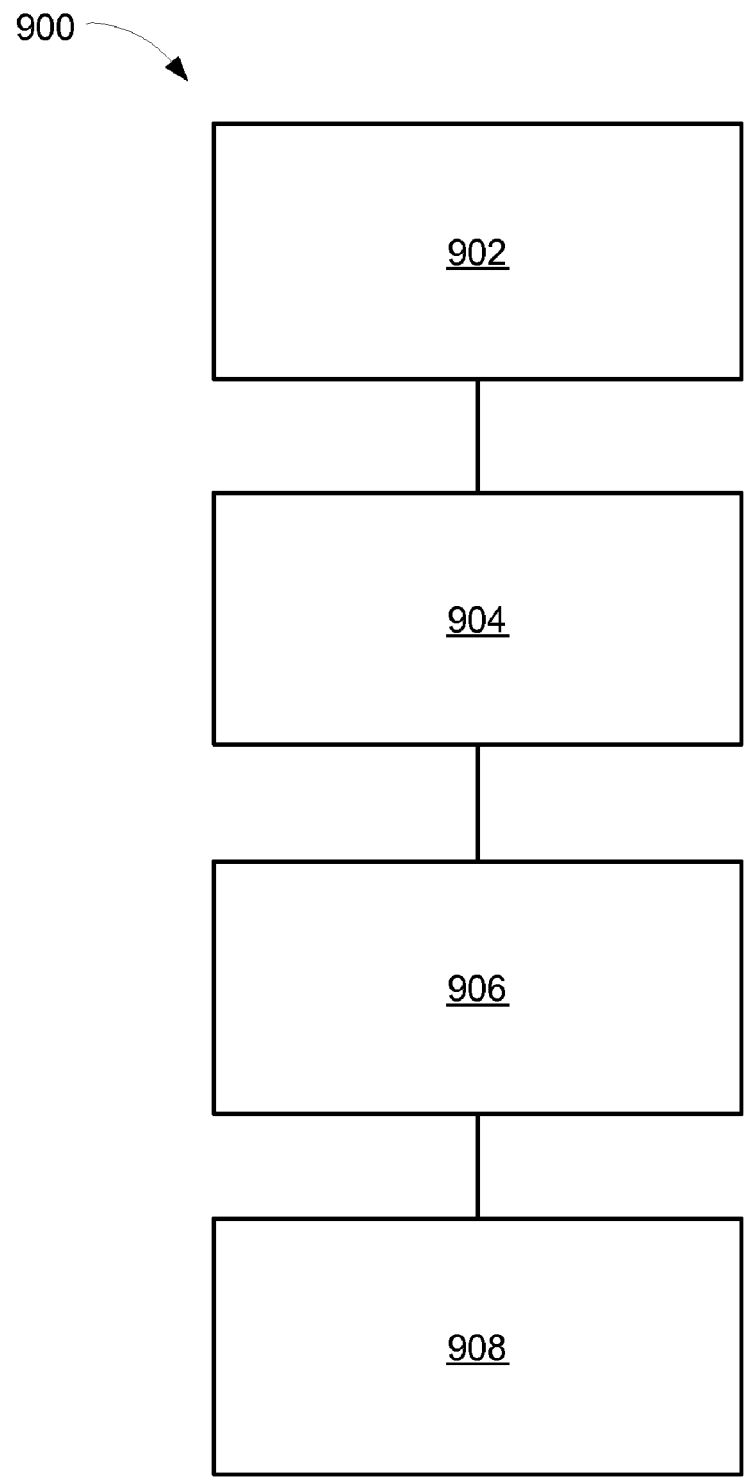
FIG. 9 is a flow chart of an integrated circuit package system for manufacture of the integrated circuit package system in an embodiment of the present invention.

Referring now to FIG. 9, therein is shown a flow chart of an integrated circuit package system 900 for manufacture of the integrated circuit package system 100 in an embodiment of the present invention. The system 900 includes forming an external interconnect having a lead tip and a lead body in a block 902; forming a recess in the lead body from a lead body top surface in a block 904; connecting an integrated circuit die and the external interconnect in a block 906; and molding the external interconnect with the recess filled in a block 908.

It has been discovered that the present invention thus has numerous aspects.

It has been discovered that the present invention provides an integrated circuit package system with improved yield and reliability. The various mold lock features require less space, improves moldability, reduces delamination, and improves performance on reliability tests, such as moisture level sensitivity (MSL) test.

An aspect is that the present invention provides increased metal to metal spacing for improved molding compound flow to form the encapsulation. The intersecting recess segments do not require additional structure, such as a lug between the external leads, to form mold locks.

Another aspect of the present invention provides multiple mold lock features for a distributed and multi-dimensional locking structure support. The intersecting recess segments as well as the paddle forms mold locks distributed throughout the integrated circuit package system. The distribution of mold locks provides support in all three dimensions of the integrated circuit system package.

Yet another aspect of the present invention provides structures for the mold lock features with improved adhesion between the leads and the encapsulation.

Yet another aspect of the present invention provides mold lock features improves reliability performance. The distributed, multi-dimensional mold locks reduces delamination of the encapsulation and improves performance in moisture sensitivity level (MSL) tests.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system method of the present invention furnishes important and heretofore unknown and unavailable solutions, capabilities, and functional aspects for improving reliability in systems. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package system comprising:
    forming an external interconnect having a lead tip and a lead body includes half etching the external interconnect to form the lead tip and the lead body;
    forming a recess in the lead body including a first recess segment, having an orientation substantially parallel to the lengthwise dimension of the lead body, and a second recess segment intersecting and perpendicular to the first recess segment along a lead body top surface of the lead body as shown in the plan view, the first recess segment at a bottom portion of the second recess segment;
    connecting an integrated circuit die and the external interconnect; and
    molding the external interconnect with the recess filled.

2. The method as claimed in claim 1 wherein the connecting includes attaching a solder bump between the integrated circuit die and the lead tip.

3. The method as claimed in claim 1 wherein the connecting includes attaching a bond wire between the integrated circuit die and the lead tip.

4. The method as claimed in claim 1 wherein forming the recess includes forming the first recess segment and the second recess segment having a length and a width including a perimeter of the first recess segment and the second recess segment on the lead body top surface.

5. The method as claimed in claim 1 wherein the molding includes covering the integrated circuit die.

6. A method of manufacturing an integrated circuit package system comprising:
    forming an external interconnect, a tie bar, and a paddle;
    forming a lead tip and a lead body includes half etching the external interconnect to form the lead tip and the lead body;
    forming a recess in the lead body including a first recess segment, having an orientation substantially parallel to the lengthwise dimension of the lead body, and a second recess segment intersecting and perpendicular to the first recess segment along a lead body top surface of the lead body as shown in the plan view, the first recess segment at a bottom portion of the second recess segment;
    connecting an integrated circuit die, over the paddle, and the external interconnect; and
    molding the external interconnect with the recess filled.

7. The method as claimed in claim 6 wherein forming the tie bar and the paddle includes connecting the tie bar and the paddle.

8. The method as claimed in claim 6 wherein the molding the external interconnect includes:
   exposing the lead body at a lead body bottom surface; and
   covering the lead tip.

9. The method as claimed in claim 6 wherein the molding includes covering the tie bar and the paddle.

* * * * *